United States Patent

Pasch et al.

Patent Number: 5,936,285
Date of Patent: Aug. 10, 1999

[54] GATE ARRAY LAYOUT TO ACCOMMODATE MULTI-ANGLE ION IMPLANTATION

[75] Inventors: Nicholas F. Pasch, Pacifica; Aldona M. Butkus, Santa Clara; Sheldon Aronowitz, San Jose, all of Calif.

[73] Assignee: LSI Logic Corporation, Milpitas, Calif.

[21] Appl. No.: 08/839,103

[22] Filed: Apr. 23, 1997

Related U.S. Application Data

[63] Continuation of application No. 08/578,050, Dec. 26, 1995, abandoned, which is a continuation of application No. 08/424,905, Apr. 19, 1995, abandoned, which is a division of application No. 08/242,246, May 13, 1994, Pat. No. 5,459,085.

[51] Int. Cl.$^6$ .......................... H01L 27/088; H01L 29/772
[52] U.S. Cl. .......................... 257/368; 257/203; 257/206; 257/255
[58] Field of Search .................................. 257/203, 206, 257/255, 368

[56] References Cited

U.S. PATENT DOCUMENTS

| | | |
|---|---|---|
| 3,612,960 | 10/1971 | Takeishi ................................. 317/235 |
| 4,733,288 | 3/1988 | Sato . |
| 4,771,012 | 9/1988 | Yabu et al. . |
| 4,853,757 | 8/1989 | Kuramitsu ................................. 357/45 |
| 5,040,035 | 8/1991 | Gabara et al. ........................ 357/23.4 |
| 5,245,208 | 9/1993 | Eimori ................................. 257/344 |
| 5,459,085 | 10/1995 | Pasen et al. . |

FOREIGN PATENT DOCUMENTS

| 61-198650 | 9/1986 | Japan . |
| 2-87550 | 3/1990 | Japan . |

Primary Examiner—Jerome Jackson, Jr.

[57] ABSTRACT

A transistor gate array includes an active transistor region (50a–50n) of transistor gates all oriented in a single direction. Surrounding the active transistor region on all four sides are input/output regions (52a–52d) each containing a row of input/output transistors. All of the I/O devices on all sides of the array are oriented in the same common direction, which is the same direction as the orientation of the active transistor in the active region. This arrangement allows the use of the benefits of high angle ion implantation with fewer ion implant steps. Where some of the transistors are oriented at right angles to others, as in the prior art, four separate directions of high angle ion implantation are required to avoid degradation of electrical properties. With all transistors, including those of the gate array and those of the input/output devices, all oriented in the same direction, only two directions high angle ion implantation are required.

11 Claims, 1 Drawing Sheet

GATE ARRAY LAYOUT TO ACCOMMODATE MULTI-ANGLE ION IMPLANTATION

RELATED APPLICATIONS

This application is a continuation of U.S. patent application Ser. No. 08/578,050 filed Dec. 26, 1995, abandoned which is a continuation application of U.S. patent application Ser. No. 08/424,905 filed on Apr. 19, 1995, abandoned which is a divisional of U.S. patent application Ser. No. 08/242,246 filed May 13, 1994, now U.S. Pat. No. 5,459,085.

BACKGROUND OF THE INVENTION

1. Field of the Invention

The present invention relates to large scale arrays of transistors, and more particularly concerns an improved arrangement of active devices in a very large scale integrated circuit configured to maximize the advantages of high angle ion implantation.

2. Description of Related Art

Very large scale integrated circuit dies typically contain large numbers of submicron transistors manufactured by multi-step procedures that include the laying down of different layers of conductive and non-conductive materials, masking and selective removal of portions of deposited layers. Selected portions of the die are typically doped with impurities to provide areas of n-type and p-type regions and to form the active devices. Implantation of impurities by use of high angle ion implantation methods are known in the integrated circuit fabrication arts to provide a number of benefits.

Typically, very large scale integrated circuits are made with a central active region in which all of the central active devices are oriented in the same direction. Positioned around the periphery of the active region, usually on all four sides thereof, are rows of input/output transistors. In prior art systems the input/output devices are oriented in each of two mutually orthogonal directions, with the input/output devices of the rows at the top and bottom of the active array, for example, being oriented in one direction and the input/output devices of the row at the left side and the row at the right side of the array being oriented in a perpendicular direction. Typically the input/output devices are oriented parallel to the edge of the integrated circuit die to which they are adjacent. With this input/output arrangement a quadrature ion implant is normally employed in order form the input/output devices. In quadrature high angle ion implantation the wafer on which the various arrays are being formed is tilted to the vertical by an angle on the order of greater than 0° to about 60°, preferably 7° to 45° and a vertically directed beam of ions are directed at the wafer. Upon completion of a first ion implant, the wafer is turned 90° and a second high angle ion implantation step is performed. The wafer is then again turned 90° a third and a fourth time, each time performing a high angle implantation, to ensure that all sides of the variously oriented transistors are subject to symmetrical ion implantation and to ensure that no parts of the devices are effectively in the shadow of raised portions of the device.

Each ion implantation step requires a finite time, and thus increased time of production results. Additionally, high angle implantation directed at the side of an active device, instead of along a line drawn from a device source to a device drain, can cause degradation of electrical properties of the field oxide edge. The quadrature orientation of the input/output devices, however, typically results in at least some high angle implantation along undesirable orientations. Accordingly, it is an object of the present invention to provide a gate array layout that significantly improves high angle ion implantation procedures.

SUMMARY OF THE INVENTION

In carrying out principles of the present invention in accordance with a preferred embodiment thereof, an integrated circuit comprising a substrate having a plurality of active devices in a control active region along with input/output regions formed, wherein an array of active semiconductor devices in the central region and a plurality of input/output devices in the input/output regions are similarly oriented. Thus all of the input/output devices in the input/output regions of the integrated circuit and active devices have in the central active region of the integrated circuit have their contacts aligned along a single axis so that the orientation of all of the active devices and all of the input/output devices is generally the same, regardless of their position on the integrated circuit. Since only a single orientation of all of the transistors, including active transistors and input/output devices is employed, only two directions of angle implantation need be employed, thus eliminating the need for high angle ion implantation steps along axes perpendicular to the source-drain orientations of the active devices.

DETAILED DESCRIPTION OF THE PREFERRED EMBODIMENTS

Figure 1:
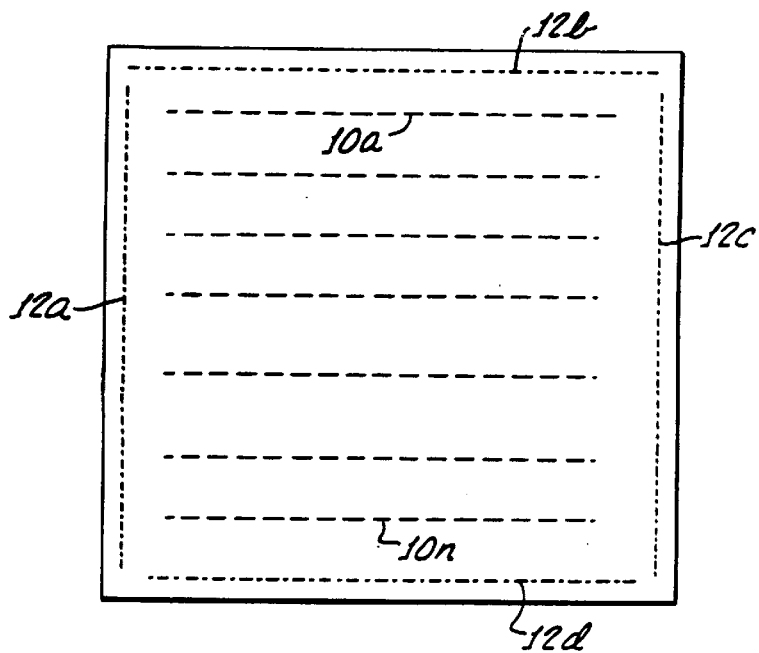
FIG. 1 illustrates a conventional very large scale device integrated circuit device.

In a conventional integrated circuit illustrated in FIG. 1, the arrangement of active devices in a central region and in peripheral input/output regions along each side of the die is shown. The rows of dashed lines, such as 10a through 10n, represent lines of similarly oriented transistors, each including a source and drain with a gate interposed between the two. In these discussions it is convenient to designate the vertical direction of the drawings as the Y axis and the horizontal direction as the X axis. Thus, the orientations of all the transistors in the lines 10a through 10n are the same, being generally oriented along the X axis. Surrounding the central region of the integrated circuit are rows 12a through 12d of input/output devices, each extending along one side or the top or bottom of the central region, or core array, 10a through 10n. The input/output transistors on the left and right sides of the core array, that is transistor rows 12a and 12c, are oriented with respect to one another such that a line from the source to the drain contacts of the individual transistors extends along the Y axis, or vertically in such conventional arrangements. The input/output devices at the top and bottom, in rows 12b and 12d of conventional integrated circuits, however, are oriented with their source to drains aligned along the X axis.

In the course of the various steps of forming the active transistors, impurities are implanted in different layers by various procedures, including high angle implantation. FIG.

Figure 2:
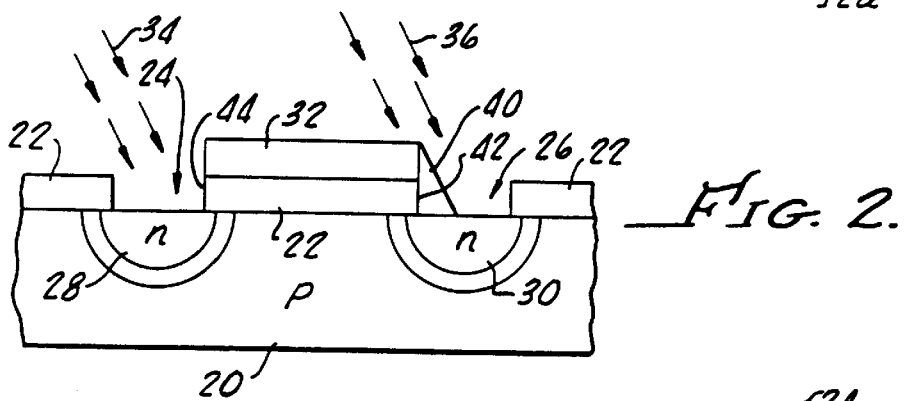
FIG. 2 is a simplified section of a single device illustrating high angle implantation.

2 is illustrative of some of the steps performed in the manufacture of, for example, a conventional field effect transistor. A p-type substrate 20 is coated with a non-conductive field oxide 22 that is etched to form open areas 24,26 between portions of the oxide. The p-type substrate 20 is then subjected to an appropriate beam of ions for implantation of n-type impurities to provide n-type regions forming a source region 28 and drain region 30 of the device. A gate 32 contact is also formed over a central portion of field oxide layer 22 between the source 28 and drain 30. The device orientation may be characterized by a line from the source to the drain. In FIG. 2 the high angle ion implantation is indicated by arrows 34,36, which show an exaggerated large angle of ion implantation, in actual practice the ion beams may be closer to a perpendicular to the surface of the device. It will be seen that an area, indicated by the shaded area 40, is effectively in the shadow of the gate at central oxide layer 22. As a consequence portions of the drain region 30 are not exposed to the angled ion beam, nor are portions of the side edges 42 of the central oxide layer. On the other hand, sides 44 of the central oxide layer are subject to the ion implantation beam so that there is lack of symmetry in the effective overall implantation. To avoid this lack of symmetry the angle of the beam is changed relative to the substrate, or more specifically and simply, the substrate is rotated 180° and the ion beam is again directed at the substrate. This time, in the reversed orientation, the shaded area 40 is not in shadow and the side 42 of the central oxide layer 22 is exposed to the ion beam. In this reversed orientation, of course, the other side of the central oxide layer 22 and the source 28 are subject to the shadowing described in connection with the initial beam orientation. Accordingly, it will be seen that for any single orientation (direction of a line from source to drain) of an active device two different angles of ion implantation and two separate ion implantation steps are generally employed, each occurring over a finite period of time. In conventional integrated circuits, where active devices are oriented in different directions, some being oriented at right angles to one another, a quadrature ion implant procedure is normally required to ensure that all devices are symmetrically exposed.

Figure 3:
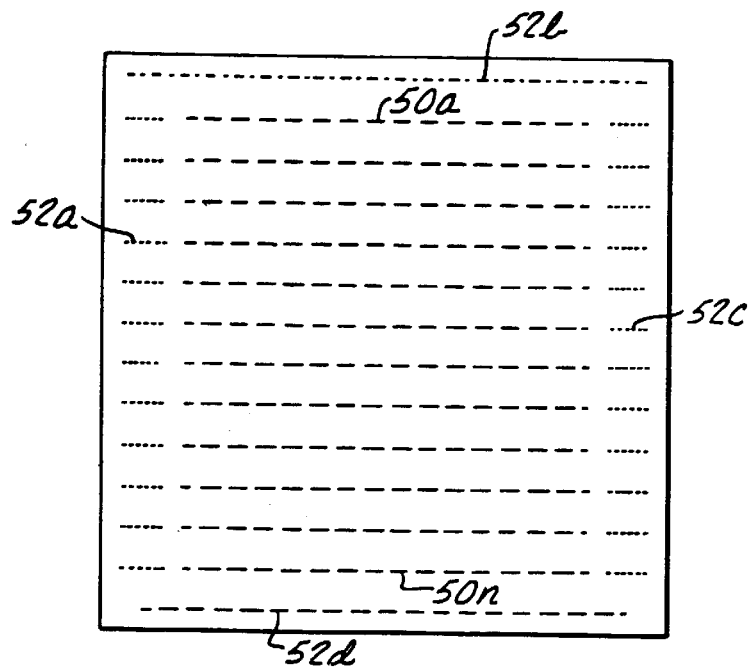
FIG. 3 illustrates the layout configuration of an integrated circuit device embodying principles of the present invention.

In accordance with principles of the present invention, to improve and simplify the manufacturing procedure of such arrays of submicron devices or transistors, the active devices and input/output devices of the array are arranged such as illustrated in FIG. 3. Thus, in FIG. 3 there is a central core or array region of active devices including a plurality of lines 50*a* through 50*n* of active transistors all oriented along a single axis such as, for example, the X axis. In addition, peripheral input/output rows or regions, including regions 52*a*,52*b*,52*c* and 52*d* are also provided.

In accordance with the present invention, the input/output devices of regions 52*a*,52*b*,52*c* and 52*d* are all oriented in the same direction as the transistors in the core array, for example parallel to the X axis, and therefore all of the transistors of the integrated circuit are oriented in the same direction. Thus, in accordance with the present invention a preferred embodiment of which is illustrated in FIG. 3, all of the devices within the core region, including devices 50*a* through 50*n*, are oriented parallel to an axis such as, for example, the X axis and similarly of the input/output devices at the top and bottom input/output regions 52*b* and 52*d* are also oriented parallel to the same axis. Moreover, all of the devices in input/output regions 52*a*,52*c* that extend along the left and right sides of the central core array are also all oriented parallel to the same axis such as the X axis as illustrated in FIG. 3. With this arrangement merely a two step or two angle ion implantation is all that is sufficient to accomplish proper ion implantation with complete symmetry. Also importantly, degradation of electrical properties of the field oxide edge resulting from perpendicular ion bombardment at high angles of ion implantation are avoided. This simple rearrangement or orientations of certain of the input/output transistors eliminates two high angle ion implantation steps and greatly reduces manufacturing time.

It will, of course, be understood that various modifications and additions can be made to the preferred embodiment of the present invention discussed above without departing from the scope or spirit of the invention. The present invention, including the alignment of input/output devices parallel to a single axis, is suitable for use in a variety of applications. For example, any high angle implementation across a full range of implant orientations from greater than 0° to angles of 75° and even up to approximately 90° may be used in connection with the present invention and benefit therefrom. Accordingly, the scope of the present invention should not be limited by the particular embodiments discussed above, but should be defined only by the claims set forth below and equivalents thereof.

We claim:

1. An integrated circuit, comprising:

a substrate having a central gate region and an input/output region, said input/output region extending along a periphery of said substrate, around said gate region and adjacent edges of said substrate;

a plurality of rows of active transistors in said gate region, each of said active transistors having a source and drain aligned to define an active transistor orientation;

a plurality of input/output transistors in said input/output region, each of said input/output transistors having a source and drain aligned to define an input/output transistor orientation;

all of said active transistor and input/output transistor orientations being parallel to each other and to an axis;

each of said active transistors in said gate region further including a field oxide layer with edges;

a concentration of impurities in said field oxide layer edges perpendicular to said axis being greater than a concentration of impurities in said field oxide layer edges parallel to said axis;

each of said input/output transistors in said input/output region further including a field oxide layer with edges; and a concentration of impurities in said field oxide layer edges of said input/output transistors perpendicular to said axis being greater than a concentration of impurities in said field oxide layer edges of said input/output transistors parallel to said axis.

2. The integrated circuit of claim 1, wherein said source and said drain of said active transistors and said input/output transistors are n-type regions.

3. The integrated circuit of claim 1, wherein said source and drain of said active transistors and said input/output transistors are p-type regions.

4. The integrated circuit of claim 1, wherein said impurities were ion beam implanted to form said source and said drain of said active transistors and said input/output transistors.

5. The integrated circuit of claim 1, wherein said greater concentration of impurities results from completing an ion beam implantation with implantation beams in only two directions.

6. The integrated circuit of claim 1, wherein all of said sources and drains of said active transistors and said input/output transistors are formed by directing a first ion implantation beam at a first angle to and toward said substrate in a manner that said direction comprises a first vector component parallel to said axis, and further being formed by directing a second ion implantation beam at a second angle to and toward said substrate in a manner that said second direction comprises a second vector component parallel to said axis and opposite to the direction of said first vector, whereby all of the ion implantation is completed with implantation beams in only two directions.

7. The integrated circuit of claim 6, wherein said greater concentration of impurities results from completing said ion beam implantation with ion beams in only said first angle and said second angle.

8. The integrated circuit of claim 6, wherein said first and second angles have the same magnitude.

9. The integrated circuit of claim 8, wherein a range of said first and second angles is greater than 0° to about 90°.

10. The integrated circuit of claim 8, wherein a preferred range of said first and second angles is greater than 0° to about 75°.

11. The integrated circuit of claim 1, wherein said input/output transistors are aligned with said rows of said active transistors.

* * * * *